United States Patent
An et al.

(10) Patent No.: US 10,345,658 B2
(45) Date of Patent: Jul. 9, 2019

(54) METHOD FOR MANUFACTURING SLIT ELECTRODE, SLIT ELECTRODE, AND DISPLAY PANEL

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yang An, Beijing (CN); Zhilong Peng, Beijing (CN); Wukun Dai, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 204 days.

(21) Appl. No.: 15/303,043

(22) PCT Filed: Dec. 10, 2015

(86) PCT No.: PCT/CN2015/097002
§ 371 (c)(1),
(2) Date: Oct. 10, 2016

(87) PCT Pub. No.: WO2016/192364
PCT Pub. Date: Dec. 8, 2016

(65) Prior Publication Data
US 2017/0139257 A1 May 18, 2017

(30) Foreign Application Priority Data
Jun. 3, 2015 (CN) .......................... 2015 1 0300844

(51) Int. Cl.
*H01L 23/20* (2006.01)
*H01L 27/10* (2006.01)
(Continued)

(52) U.S. Cl.
CPC ........ *G02F 1/13439* (2013.01); *C23C 14/042* (2013.01); *C23C 14/0605* (2013.01);
(Continued)

(58) Field of Classification Search
CPC ........................... H01L 23/585; H01L 27/124
See application file for complete search history.

(56) References Cited

U.S. PATENT DOCUMENTS 8,497,966 B2 * 7/2013 Choi ................. G02F 1/134363
349/141
8,610,860 B2 * 12/2013 Huang .............. G02F 1/136227
349/141
(Continued)

FOREIGN PATENT DOCUMENTS

CN 102142393 A 8/2011
CN 103107133 A 5/2013
(Continued)

OTHER PUBLICATIONS

International Search Report and Written Opinion for Application No. PCT/CN2015/097002, dated Mar. 10, 2016, 10 Pages.

*Primary Examiner* — Seahvosh Nikmanesh
(74) *Attorney, Agent, or Firm* — Brooks Kushman P.C.

(57) ABSTRACT

The present disclosure provides a method for manufacturing a slit electrode, the slit electrode, and a display panel. The method includes steps of forming a first photoresist pattern on a passivation layer, the first photoresist pattern being of a shape identical to a slit of the slit electrode, forming a slit electrode pattern on the passivation layer with the first photoresist pattern, the slit electrode pattern being covering
(Continued)

with a second photoresist pattern which has a shape identical to the slit electrode; and removing the first photoresist pattern and the second photoresist pattern.

13 Claims, 7 Drawing Sheets

(51) Int. Cl.
    *G02F 1/1343*     (2006.01)
    *H01L 23/58*     (2006.01)
    *H01L 27/12*     (2006.01)
    *C23C 14/04*     (2006.01)
    *C23C 14/06*     (2006.01)
    *C23C 14/08*     (2006.01)
    *C23C 14/34*     (2006.01)
    *G03F 7/00*     (2006.01)

(52) U.S. Cl.
    CPC ............ *C23C 14/086* (2013.01); *C23C 14/34* (2013.01); *G02F 1/134309* (2013.01); *G03F 7/0035* (2013.01); *H01L 23/585* (2013.01); *H01L 27/124* (2013.01); *G02F 2201/123* (2013.01)

(56) References Cited

U.S. PATENT DOCUMENTS

| | | | |
|---|---|---|---|
| 9,691,790 B2* | 6/2017 | Li | ............ H01L 27/124 |
| 2010/0317196 A1 | 12/2010 | Nakamura | |
| 2012/0292620 A1* | 11/2012 | Tsou | ............ H01L 27/1288 257/57 |
| 2015/0372018 A1 | 12/2015 | Zhang et al. | |
| 2016/0238882 A1* | 8/2016 | Yang | ............ G02F 1/133528 |
| 2017/0017115 A1* | 1/2017 | Kim | ............ G02F 1/13439 |
| 2017/0139257 A1 | 5/2017 | An et al. | |

FOREIGN PATENT DOCUMENTS

| | | |
|---|---|---|
| CN | 104103583 A | 10/2014 |
| CN | 105093823 A | 11/2015 |
| JP | 2005268373 A | 9/2005 |

\* cited by examiner

FIG. 11

METHOD FOR MANUFACTURING SLIT ELECTRODE, SLIT ELECTRODE, AND DISPLAY PANEL

CROSS-REFERENCE TO RELATED APPLICATIONS

This application is the U.S. national phase of PCT Application No. PCT/CN2015/097002 filed on Dec. 10, 2015, which claims priority to Chinese Patent Application No. 201510300844.2 filed on Jun. 3, 2015, the disclosures of which are incorporated in their entirety by reference herein.

TECHNICAL FIELD

The present disclosure relates to the field of display technology, in particular to a method for manufacturing a slit electrode, the slit electrode, and a display panel.

BACKGROUND

Depending on display modes, liquid crystal panels may include a twisted nematic (TN) liquid crystal panel, an in-plane switching (IPS) liquid crystal panel and an advanced super dimension switch (ADS) liquid crystal panel. For the ADS liquid crystal panel, a multi-dimensional electric field is formed by means of electrical fields generated at edges of slit electrodes within an identical plane and an electrical field generated between a slit electrode layer and a plate electrode layer, so as to enable all the liquid crystal molecules between the slit electrodes and right above the electrodes within a liquid crystal cell to rotate, so as to improve the operational efficiency of the liquid crystal molecules and enhance the light transmission efficiency. The ADS liquid crystal panel has been widely used due to its advantages such as high image quality, high resolution, high transmittance, low power consumption, wide viewing angle, high aperture ratio, low chromatic aberration and free of push Mura.

In the related art, during the manufacture of the slit electrode for the ADS liquid crystal panel, usually such processes as film coating, adhesive coating, exposing, developing, etching and removing may be used sequentially. A wet chemical etching process is commonly used. However, in the case that the slit electrode is formed through the wet chemical etching process, usually a material for forming the slit electrode may be left at a slit. As a result, a short circuit may occur, and thereby such defects as mura, low transmittance and an uneven liquid crystal alignment film (e.g., cell polyimide (PI)) may occur. Hence, there is an urgent need to prevent the occurrence of the remaining material at the slit of the slit electrode.

SUMMARY

An object of the present disclosure is to provide a method for manufacturing a slit electrode, the slit electrode and a display panel, so as to prevent the occurrence of the remaining material at the slit of the slit electrode.

In one aspect, the present disclosure provides in some embodiments a method for manufacturing a slit electrode, including steps of: forming a first photoresist pattern on a passivation layer, the first photoresist pattern being of a shape identical to a slit of the slit electrode; forming a slit electrode pattern on the passivation layer with the first photoresist pattern, the slit electrode pattern being covering with a second photoresist pattern which has a shape identical to the slit electrode; and removing the first photoresist pattern and the second photoresist pattern.

Optionally, the step of forming the first photoresist pattern on the passivation layer includes: coating a first photoresist layer onto the passivation layer; placing a first mask plate on the first photoresist layer, and exposing a photoresist at a position not shielded by the first mask plate; and developing the first photoresist layer obtained after the exposure to form the first photoresist pattern.

Optionally, the step of forming the slit electrode pattern on the passivation layer with the first photoresist pattern includes: forming an electrode material layer on the passivation layer with the first photoresist pattern; coating a second photoresist layer onto the electrode material layer; placing a second mask plate on the second photoresist layer, and exposing a photoresist at a position not shielded by the second mask plate; developing the second photoresist layer obtained after the exposure to form the second photoresist pattern; and etching the electrode material layer covered with the second photoresist pattern to form the slit electrode pattern.

Optionally, the step of forming the electrode material layer on the passivation layer with the first photoresist pattern includes forming the electrode material layer on the passivation layer by sputtering.

Optionally, the slit electrode pattern includes an indium tin oxide pattern.

Optionally, the slit electrode pattern includes a graphene pattern.

Optionally, the photoresist is coated by a static coating process or a dynamic coating process.

Optionally, in the case that the photoresist is coated by the static coating process, the step of coating the photoresist includes: accumulating the photoresist at a center of the passivation layer through a pipeline, an amount of the photoresist depending on a size of the passivation layer and a type of the photoresist; enabling the accumulated photoresist to spread out; and rotating the passivation layer to enable the photoresist to be coated evenly on the passivation layer.

Optionally, in the case that the photoresist is coated by the dynamic coating process, the step of coating the photoresist includes rotating the passivation layer while the photoresist is sprayed onto the passivation layer, to spread out the photoresist once the photoresist is in contact with the passivation layer, thereby to form the even photoresist layer.

Optionally, the mask plate is made of an opaque material, and after the photoresist at the position not shielded by the mask plate is exposed, the photoresist of the photoresist layer irradiated by light is polymerized to form a polymer.

In another aspect, the present disclosure provides in some embodiments a slit electrode manufactured by the above-mentioned method.

In yet another aspect, the present disclosure provides in some embodiments a display panel including the above-mentioned slit electrode.

Optionally, the display panel includes an ADS display panel, and the slit electrode is a pixel electrode.

According to the embodiments of the present disclosure, the first photoresist pattern is formed on the passivation layer, and the first photoresist pattern has a shape identical to the slit of the slit electrode. Then, the slit electrode pattern is formed on the passivation layer with the first photoresist pattern, and the slit electrode pattern is covered with the second photoresist pattern which has a shape identical to the slit electrode. Finally, the first photoresist pattern and the second photoresist pattern are removed. During the removal of the first photoresist pattern and the second photoresist pattern, it is able to remove from the slit of the slit electrode the electrode material that has not been etched yet. As a result, it is able to prevent the occurrence of the remaining material at the slit of the slit electrode.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

It should be appreciated that, such words as "first" and "second" used in the embodiments of the present disclosure are merely used to differentiate identical or similar components having substantially the same function, rather than to represent any number or order. In addition, such words "upper" and "lower" are merely used on the basis of the order of the steps for forming the slit electrode. For example, an upper pattern refers to the pattern formed subsequently, and a lower pattern refers to the pattern formed previously. Further, a scale of each layer in the drawings is used for illustrative purposes only, but shall not represent a real scale of layer, or shall not construed as limiting the scope of the present disclosure.

Figure 1:
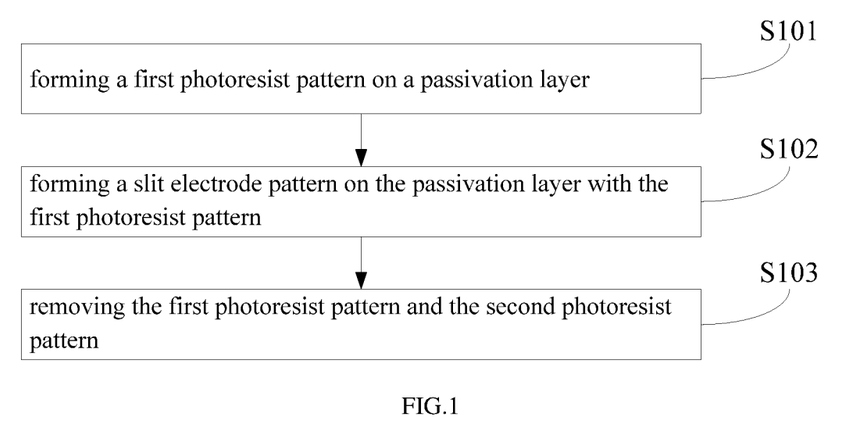
FIG. 1 is a flow chart of a method for manufacturing a slit electrode according to one embodiment of the present disclosure.

The present disclosure provides in some embodiments a method for manufacturing a slit electrode which, as shown in FIG. 1, includes: Step S101 of forming a first photoresist pattern on a passivation layer, the first photoresist pattern being of a shape identical to a slit of the slit electrode; Step S102 of forming a slit electrode pattern on the passivation layer with the first photoresist pattern, the slit electrode pattern being covering with a second photoresist pattern which has a shape identical to the slit electrode; and Step 103 of removing the first photoresist pattern and the second photoresist pattern.

According to the method in the embodiments of the present disclosure, the first photoresist pattern is formed on the passivation layer, and the first photoresist pattern has a shape identical to the slit of the slit electrode. Then, the slit electrode pattern is formed on the passivation layer with the first photoresist pattern, and the slit electrode pattern is covered with the second photoresist pattern which has a shape identical to the slit electrode. Finally, the first photoresist pattern and the second photoresist pattern are removed. During the removal of the first photoresist pattern and the second photoresist pattern, it is able to remove from the slit of the slit electrode the electrode material that has not been etched yet. As a result, it is able to prevent the occurrence of the remaining material at the slit of the slit electrode.

Figure 2:
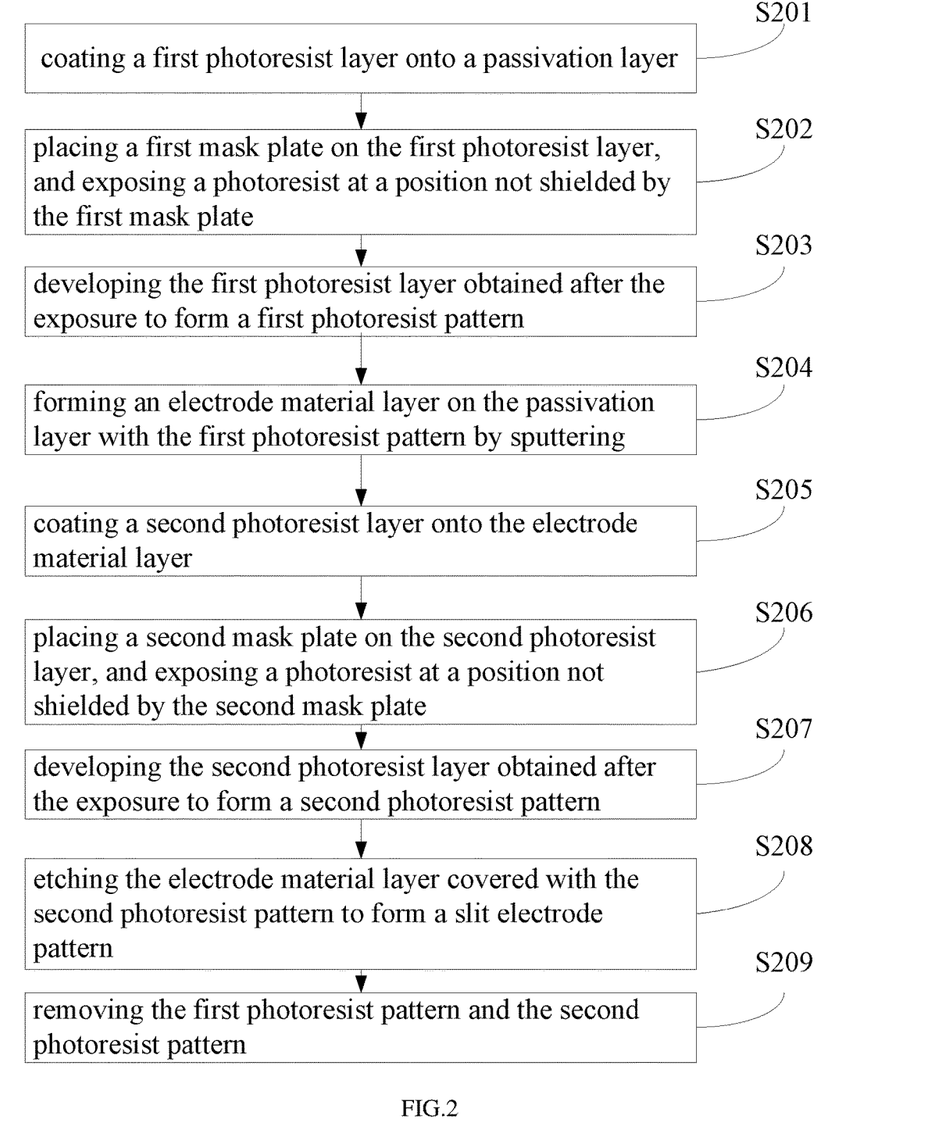
FIG. 2 is another flow chart of the method for manufacturing a slit electrode according to one embodiment of the present disclosure.

Referring to FIG. 2, the method specifically includes the following steps.

Step S201: coating a first photoresist layer onto the passivation layer. The passivation layer may also be called as protection layer, which is configured to separate two adjacent layers from each other, or protect the other layer, e.g., a gate insulation layer on an array substrate. The photoresist usually includes a polymer, a solvent, a photosensitizer and an additive. Under a specific condition, the photoresist may be polymerized into a polymer. One kind of the photoresist may be polymerized into a polymer in the case of being irradiated by light, and another kind of the photoresist may be polymerized into a polymer in the case of not being irradiated by light. In the embodiments of the present disclosure, the former is taken as an example.

Figure 3:
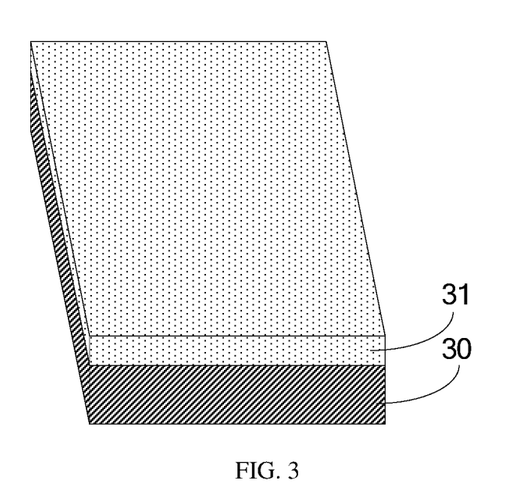
FIG. 3 is a schematic view showing a passivation layer and a first photoresist layer according to one embodiment of the present disclosure.

Referring to FIG. 3, a first photoresist layer 31 is coated onto the passivation layer 30. Usually, the photoresist may be coated by a static coating process or a dynamic coating process. In the case that the photoresist is coated by the static coating process, the step of coating the photoresist includes: accumulating the photoresist at a center of the passivation layer through a pipeline, an amount of the photoresist depending on a size of the passivation layer and a type of the photoresist; enabling the accumulated photoresist to spread out; and rotating the passivation layer so as to enable the photoresist to be coated evenly on the passivation layer. In the case that the photoresist is coated by the dynamic coating process, the step of coating the photoresist includes rotating the passivation layer while the photoresist is sprayed onto the passivation layer, so as to spread out the photoresist once the photoresist is in contact with the passivation layer. In the case that dynamic coating process is used, it is able to form a more even photoresist layer using fewer photoresist. In the embodiments of the present disclosure, the process of coating the photoresist is not particularly defined, as long as the even photoresist layer may be formed.

Figure 4:
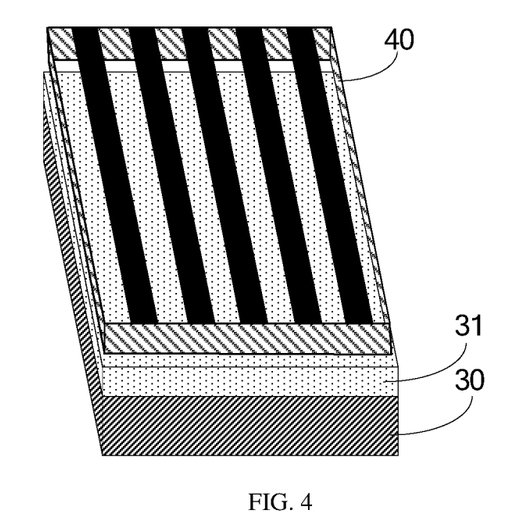
FIG. 4 is a schematic view showing a first mask plate according to one embodiment of the present disclosure.

Step S202: placing a first mask plate on the first photoresist layer, and exposing a photoresist at a position not shielded by the first mask plate. Referring to FIG. 4, a first mask plate 40 made of an opaque material may be placed on the first photoresist layer obtained after Step S201. Then, the photoresist at the position not shielded by the first mask plate may be exposed, so as to enable the photoresist of the first photoresist layer irradiated by light to be polymerized into a polymer.

Figure 5:
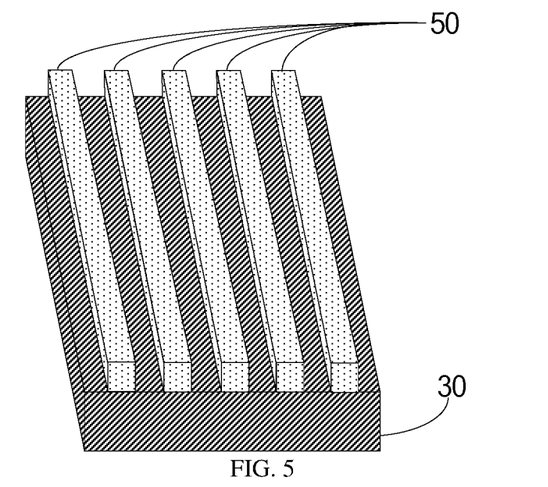
FIG. 5 is a schematic view showing a first photoresist pattern according to one embodiment of the present disclosure.

Step S203: developing the first photoresist layer obtained after the exposure so as to form the first photoresist pattern. After the exposure, the shape of the first photoresist pattern is recorded on the first photoresist layer. Then, the unpolymerized photoresist is decomposed chemically and removed, so as to develop the first photoresist pattern. In other word, the pattern of the mask plate is transfer to the photoresist layer through development. Usually, a developing process includes a wet developing process and a dry developing process. The former includes an impregnation developing process, a spray developing process, and a coagulation developing process. The latter includes a plasma etching process. These developing processes are all known in the art, and thus will not be particularly defined herein. As shown in FIG. 5, the first photoresist pattern 50 is formed on the passivation layer 30.

Step S204: forming the electrode material layer on the passivation layer with the first photoresist pattern by sputtering. A principle of the sputtering process will be described as follows. A surface of a target may be impacted by high-energy electrons in a vacuum chamber, so as to deposit the resultant particles onto a substrate to form a film. Usually, no chemical reaction occurs during the sputtering process. In other words, the sputtering process is one of the physical vapor deposition (PVD) processes, and it is usually used to form a metal electrode.

Figure 6:
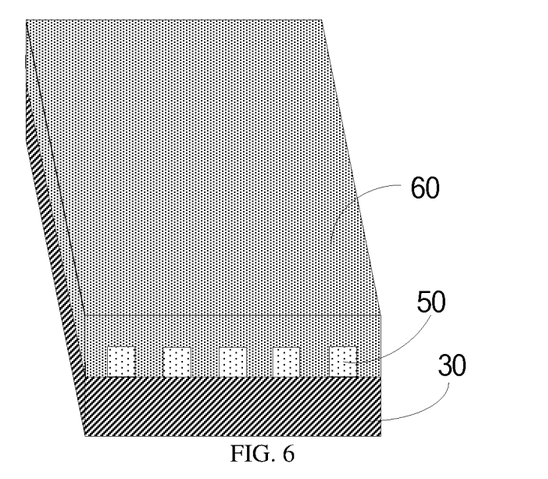
FIG. 6 is a schematic view showing an electrode material layer according to one embodiment of the present disclosure.

For example, the electrode material may be ITO or graphene, so the formed slit electrode pattern may be an ITO pattern or graphene pattern. ITO is one of the most commonly-used materials for a transparent electrode, and it includes indium oxide having high transmittance and tin oxide having very high conductivity. Hence, ITO is a conductive material having high transmittance. Graphene is a novel carbonaceous material having a two-dimensional cellular structure formed by a single layer of carbon atoms. It has a mobility ratio of 200,000 cm$^2$/Vs, almost 100 times the mobility ratio of silicon, and it has conductivity close to copper. Further, the transmittance of a graphene film is up to 97.7%, far greater than a common conductive film. In addition, graphene has high flexibility. Hence, in the case that graphene is used as the electrode material, it is able to not only increase the transmittance and the conductivity of the slit electrode, but also to increase the strength of the slit electrode. As shown in FIG. 6, the electrode material layer 60 is formed on the passivation layer 30 with the first photoresist pattern 50.

Figure 7:
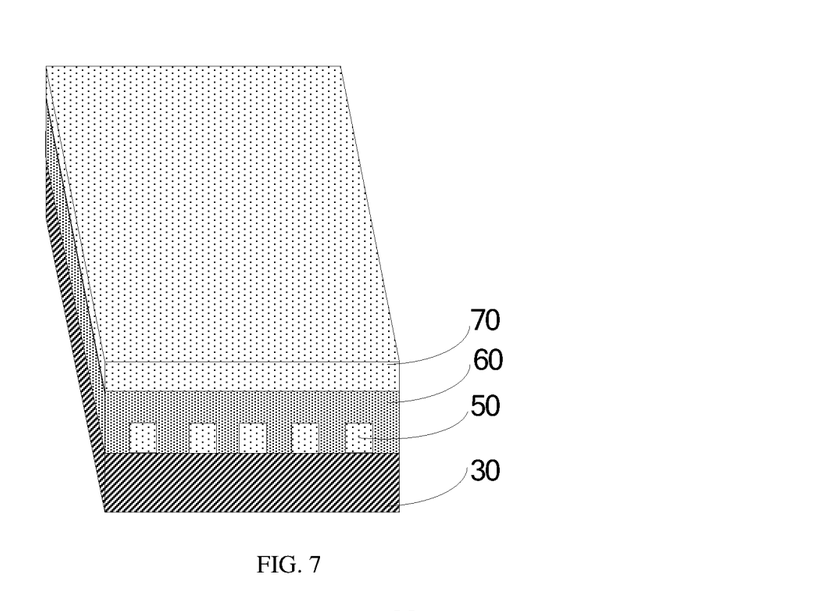
FIG. 7 is a schematic view showing a second photoresist layer according to one embodiment of the present disclosure.

Step S205: coating a second photoresist layer onto the electrode material layer. In this step, the second photoresist layer may be coated onto the electrode material layer in a similar way as that in Step S201, and thus will not be particularly defined herein. As shown in FIG. 7, the second photoresist layer 70 is formed on the electrode material layer 60.

Figure 8:
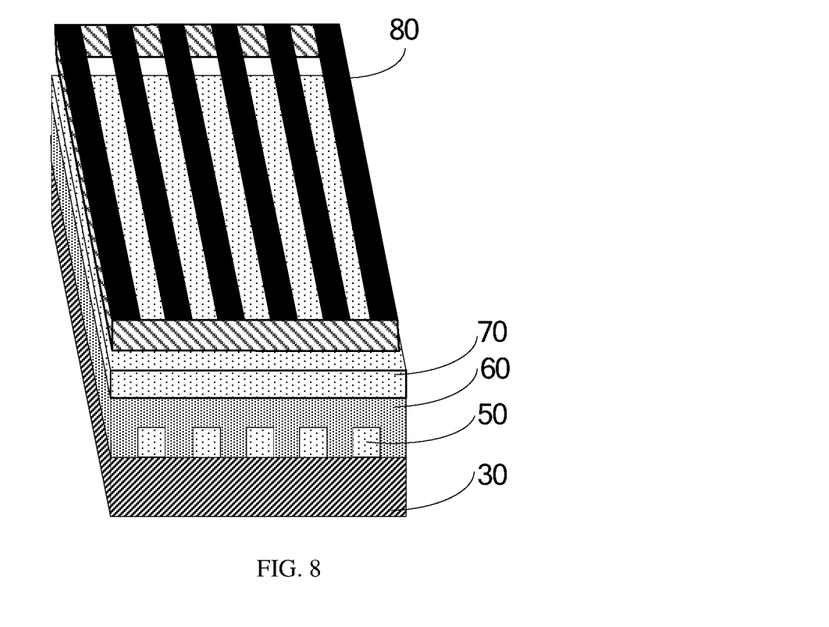
FIG. 8 is a schematic view showing a second mask plate according to one embodiment of the present disclosure.

Step S206: placing a second mask plate on the second photoresist layer, and exposing a photoresist at a position not shielded by the second mask plate. Identically, in this step, the second mask plate may be arranged on the second photoresist layer and the photoresist at the position not shielded by the second mask plate may be exposed in a similar way as that in Step S202. The only difference lies in that, a shape of a transmitting region of the first mask plate in Step S202 is different from a shape of a transmitting region of the second mask plate in Step S206. In Step S202, a shape of a non-transmitting region of the first mask plate is identical to a shape of the slit of the slit electrode, and in Step S206, a shape of a non-transmitting region of the second mask plate is identical to a shape of the slit electrode. As shown in FIG. 8, the second mask plate 80 is arranged on the second photoresist layer 70, so as to expose the photoresist at the position not shielded by the second mask plate 80.

Figure 9:
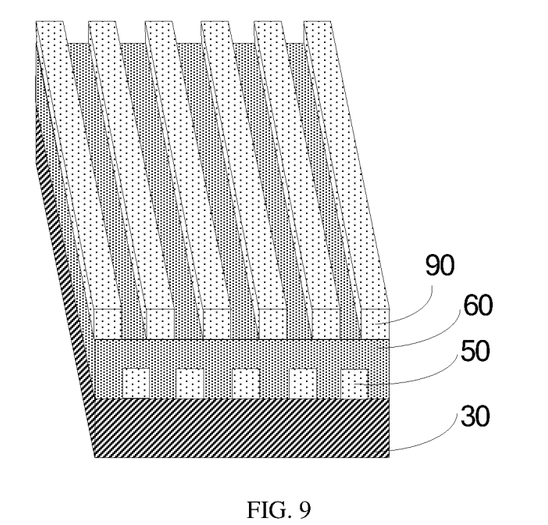
FIG. 9 is a schematic view showing a second photoresist pattern according to one embodiment of the present disclosure.

Step S207: developing the second photoresist layer obtained after the exposure to form the second photoresist pattern. A developing process in this step may be similar to that in Step S203, and thus will not be particularly defined herein. As shown in FIG. 9, the second photoresist layer 70 obtained after the exposure is developed to form the second photoresist pattern 90.

Figure 10:
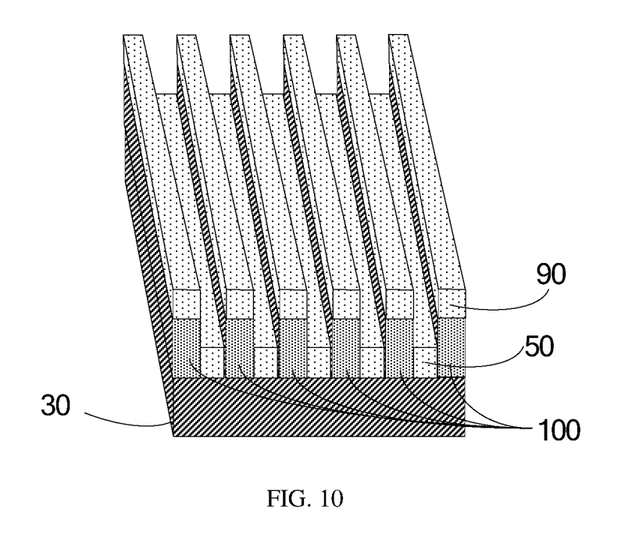
FIG. 10 is a schematic view showing a slit electrode pattern according to one embodiment of the present disclosure.

Step S208: etching the electrode material layer covered with the second photoresist pattern to form the slit electrode pattern. An etching process usually includes a dry etching process and a wet etching process. The former is mainly used for etching a non-metallic film, and it includes a plasma etching (PE) process, and a reactive ion etching (RIE) process. The latter is mainly used for etching a metallic film, and it essentially includes dissolving the metallic film in a strong acid solution and subjecting the metallic film to redox reduction. In the embodiments of the present disclosure, the etching process is not particularly defined, as long as the slit electrode pattern may be formed by etching. As shown in FIG. 10, the electrode material layer 60 covered with the second photoresist pattern 70 is etched to form the slit electrode pattern 100.

Figure 11:
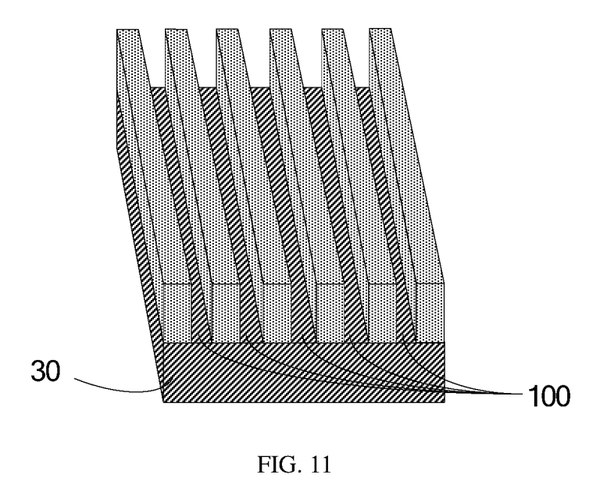
FIG. 11 is a schematic view showing the slit electrode formed after the first photoresist pattern and the second photoresist pattern has been removed according to one embodiment of the present disclosure.

Step S209: removing the first photoresist pattern and the second photoresist pattern. This step aims to remove all the photoresist. Currently, a commonly-used method includes removing the photoresist through a stripping agent. To be specific, the passivation layer with the slit electrode pattern, the first photoresist pattern and the second photoresist pattern may be immersed in the stripping agent, so as to dissolve the photoresist. At this time, the unetched electrode material attached to the second photoresist pattern may also be removed from the slit electrode pattern along with the removal of the second photoresist pattern, thereby to prevent the occurrence of the remaining material at the slit of the slit electrode. In FIG. 11, 100 represents the slit electrode pattern after the removal of the first photoresist pattern and the second photoresist pattern.

The present disclosure further provides in some embodiments the slit electrode manufactured by the above-mentioned method. According to the slit electrode in the embodiments of the present disclosure, it is able to prevent the occurrence of the remaining material at the slit of the slit electrode.

The present disclosure further provides in some embodiments a display panel including the above-mentioned slit electrode. The display panel may be any product or member having a display function, such as an electronic paper, a mobile phone, a flat-panel computer, a television, a display, a laptop computer, a digital photo frame or a navigator.

For example, the display panel may be an ADS display panel, and the slit electrode may be a pixel electrode.

Of course, the display panel may also be an IPS display panel or a fringe field switching (FFS) display panel, as long as the display panel includes the above-mentioned slit electrode.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method for manufacturing a slit electrode, comprising steps of:

forming a first photoresist pattern on a passivation layer, the first photoresist pattern being of a shape identical to a slit of the slit electrode;

forming an electrode material layer on the passivation layer with the first photoresist pattern, the electrode material layer being covered with a second photoresist pattern which has a shape identical to the slit electrode, wherein the first photoresist layer and the second photoresist layer are positioned on two sides of the electrode material layer in the direction perpendicular to the passivation layer, and the first photoresist layer, the second photoresist layer and the electrode material layer are overlapped with each other in the direction perpendicular to the passivation layer; and removing the first photoresist pattern and the second photoresist pattern to form a slit electrode pattern on the passivation layer.

2. The method according to claim 1, wherein the step of forming the first photoresist pattern on the passivation layer comprises:

coating a first photoresist layer onto the passivation layer;

placing a first mask plate on the first photoresist layer, and exposing a photoresist at a position not shielded by the first mask plate; and developing the first photoresist layer obtained after the exposure to form the first photoresist pattern.

3. The method according to claim 1, wherein the step of forming the slit electrode pattern on the passivation layer comprises:

forming an electrode material layer on the passivation layer with the first photoresist pattern;

coating a second photoresist layer onto the electrode material layer;

placing a second mask plate on the second photoresist layer, and exposing a photoresist at a position not shielded by the second mask plate;

developing the second photoresist layer obtained after the exposure to form the second photoresist pattern; and etching the electrode material layer covered with the second photoresist pattern to form the slit electrode pattern.

4. The method according to claim 3, wherein the step of forming the electrode material layer on the passivation layer with the first photoresist pattern comprises forming the electrode material layer on the passivation layer by sputtering.

5. The method according to claim 1, wherein the slit electrode pattern comprises an indium tin oxide pattern.

6. The method according to claim 1, wherein the slit electrode pattern comprises a graphene pattern.

7. The method according to claim 2, wherein the photoresist is coated by a static coating process or a dynamic coating process.

8. The method according to claim 7, wherein in the case that the photoresist is coated by the static coating process, the step of coating the photoresist comprises:

accumulating the photoresist at a center of the passivation layer through a pipeline, an amount of the photoresist depending on a size of the passivation layer and a type of the photoresist;

enabling the accumulated photoresist to spread out; and rotating the passivation layer to enable the photoresist to be coated evenly on the passivation layer.

9. The method according to claim 7, wherein in the case that the photoresist is coated by the dynamic coating process, the step of coating the photoresist comprises rotating the passivation layer while the photoresist is sprayed onto the passivation layer, to spread out the photoresist once the photoresist is in contact with the passivation layer, thereby to form the even photoresist layer.

10. The method according to claim 2, wherein the mask plate is made of an opaque material, and after the photoresist at the position not shielded by the mask plate is exposed, the photoresist of the photoresist layer irradiated by light is polymerized to form a polymer.

11. The method according to claim 3, wherein the photoresist is coated by a static coating process or a dynamic coating process.

12. The method according to claim 3, wherein the mask plate is made of an opaque material, and after the photoresist at the position not shielded by the mask plate is exposed, the photoresist of the photoresist layer irradiated by light is polymerized to form a polymer.

13. The method according to claim 1, wherein the first photoresist pattern and the second photoresist pattern are not overlapped with each other in the direction perpendicular to the passivation layer.

* * * * *